United States Patent
Jin

(10) Patent No.: US 10,658,414 B1
(45) Date of Patent: May 19, 2020

(54) IMAGE CAPTURING MODULE AND PORTABLE ELECTRONIC DEVICE

(71) Applicant: AZUREWAVE TECHNOLOGIES, INC., New Taipei (TW)

(72) Inventor: Chuan Jin, Zhongxiang (CN)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 16/285,739

(22) Filed: Feb. 26, 2019

(30) Foreign Application Priority Data

Dec. 5, 2018 (TW) .............................. 107143673 A

(51) Int. Cl.
*H01L 27/146* (2006.01)
*H04N 5/225* (2006.01)

(52) U.S. Cl.
CPC .. *H01L 27/14636* (2013.01); *H01L 27/14621* (2013.01); *H01L 27/14627* (2013.01); *H04N 5/2253* (2013.01); *H04N 5/2254* (2013.01)

(58) Field of Classification Search
CPC ......... H01L 27/14618; H01L 27/14621; H01L 27/14625; H01L 21/52; H01L 2021/60007; H01L 2021/6027; H01L 2224/81801; H01L 27/14636; H01L 27/14627; H04N 5/2254; H04N 5/2251; H04N 5/2253

See application file for complete search history.

(56) References Cited

U.S. PATENT DOCUMENTS

| | | | |
|---|---|---|---|
| 2003/0025825 A1* | 2/2003 | Nakajoh | H01L 27/14618 348/374 |
| 2006/0001761 A1* | 1/2006 | Haba | H01L 27/14618 348/340 |
| 2006/0097335 A1* | 5/2006 | Kim | H01L 27/14618 257/433 |
| 2007/0269205 A1* | 11/2007 | Lee | G03B 17/02 396/542 |
| 2008/0217715 A1* | 9/2008 | Park | H01L 27/14618 257/434 |

(Continued)

FOREIGN PATENT DOCUMENTS

TW       I228804 B      3/2005
TW       200802750 A    1/2008
(Continued)

*Primary Examiner* — Chiawei Chen
(74) *Attorney, Agent, or Firm* — Li & Cai Intellectual Propeny (USA) Office

(57) ABSTRACT

The present invention provides an image capturing module and a portable electronic device, including a circuit substrate, an image sensing chip, a filter element, and a lens assembly. The upper surface of the circuit substrate includes a chip placing area, a first solder area, and a second solder area. The upper surface of the image sensing chip includes an image sensing area, a carrier area, a first conductive area, and a second conductive area, and the carrier area surrounds the image sensing area. The lower surface of the filter element has a light transmitting area and a connecting area surrounding the light transmitting area. The first conductive area and the second conductive area of the image sensing chip are electrically and respectively connected to the first solder area and the second solder area of the circuit substrate.

10 Claims, 15 Drawing Sheets

(56) References Cited

U.S. PATENT DOCUMENTS

| | | | | |
|---|---|---|---|---|
| 2009/0161006 A1* | 6/2009 | Lee | ............ | H04N 5/2252 348/374 |
| 2010/0244166 A1* | 9/2010 | Shibuta | ............ | H01L 27/14618 257/432 |
| 2012/0044414 A1* | 2/2012 | Chen | ............ | H04N 5/2251 348/374 |
| 2014/0168510 A1* | 6/2014 | Hamada | ............ | H01L 27/14618 348/374 |
| 2015/0372037 A1* | 12/2015 | Tomeba | ............ | H01L 27/14618 257/432 |
| 2017/0142303 A1* | 5/2017 | Wang | ............ | H01L 27/14618 |
| 2017/0264800 A1* | 9/2017 | Wang | ............ | H04N 5/2258 |
| 2017/0280027 A1* | 9/2017 | Wang | ............ | H01L 27/14618 |
| 2019/0043910 A1* | 2/2019 | Miyazawa | ............ | H01L 27/14636 |
| 2019/0141224 A1* | 5/2019 | Park | ............ | H04N 5/2254 |
| 2020/0007726 A1* | 1/2020 | Wang | ............ | G03B 17/12 |

FOREIGN PATENT DOCUMENTS

| | | |
|---|---|---|
| TW | I544123 B | 8/2016 |
| TW | M550473 U | 10/2017 |

\* cited by examiner

IMAGE CAPTURING MODULE AND PORTABLE ELECTRONIC DEVICE

This application claims the benefit of priority to Taiwan Patent Application No. 107143673, filed on Dec. 5, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an image capturing module and portable electronic device, and more particularly to an image capturing module and a portable electronic device for reducing the width of an image sensor.

BACKGROUND OF THE DISCLOSURE

In the conventional technology pertaining to related art, the special advantage of Complementary Metal-Oxide-Semiconductor (CMOS) image sensors is characterized by "low power consumption" and "small volume". Therefore, CMOS image sensors can be easily integrated into portable electronic products with special requirements. For example, CMOS image sensors can be easily integrated into portable electronic products with small integration space, such as smart phones, tablets or notebooks, etc.

However, the width of conventional CMOS image sensors still cannot be effectively shortened. Therefore, how the width of the conventional CMOS image sensor can be effectively shortened by making improvements to the structural design thereof has become an important issue in the industry.

SUMMARY OF THE DISCLOSURE

In response to the above-referenced technical inadequacies, the present disclosure provides an image capturing module and a portable electronic device.

In one aspect, the present disclosure provides an image capturing module, including a circuit substrate, an image sensing chip, a filter element, and a lens assembly. The circuit substrate has an upper surface and a lower surface. An image sensing chip is disposed on the upper surface of the circuit substrate. A filter element is disposed on the image sensing chip. The lens assembly includes a holder structure disposed on the circuit substrate and a lens structure disposed on the holder structure. The upper surface of the circuit substrate includes a chip placing area, a first solder area, and a second solder area. The first solder area is connected between a first side of the chip placing area and a first side of the circuit substrate, the second solder area is connected between a second side of the chip placing area and a second side of the circuit substrate, and a third side of the chip placing area is connected to a third side of the circuit substrate. The upper surface of the image sensing chip includes an image sensing area, a carrier area, a first conductive area and a second conductive area. The first conductive area is connected between a first side of the carrier area and a first side of the image sensing chip, the second conductive area is connected between a second side of the carrier area and a second side of the image sensing chip, the carrier area surrounds the image sensing area, and a third side of the carrier area is connected to a third side of the image sensing chip. The lower surface of the filter element has a light transmitting area and a connecting area surrounding the light transmitting area. The first conductive area and the second conductive area of the image sensing chip are electrically and respectively connected to the first solder area of the circuit substrate and the second solder area, the connecting area of the filter element corresponds to the carrier area of the image sensing chip.

In one aspect, the present disclosure provides a portable electronic device, including a portable electronic module and an image capturing module. The image capturing module deposed on the portable electronic module, including a circuit substrate, an image sensing chip, a filter element, and a lens assembly. The circuit substrate has an upper surface and a lower surface. The image sensing chip is disposed on the upper surface of the circuit substrate. The filter element is disposed on the image sensing chip. The lens assembly includes a holder structure disposed on the circuit substrate and a lens structure disposed on the holder structure. The upper surface of the circuit substrate includes a chip placing area, a first solder area, and a second solder area. The first solder area is connected between a first side of the chip placing area and a first side of the circuit substrate, the second solder area is connected between a second side of the chip placing area and a second side of the circuit substrate, and a third side of the chip placing area is coupled to a third side of the circuit substrate. The upper surface of the image sensing chip includes an image sensing area, a carrier area, a first conductive area, and a second conductive area. The first conductive area is connected between a first side of the carrier area and a first side of the image sensing chip, the second conductive area is connected between a second side of the carrier area and a second side of the image sensing chip, the carrier area surrounds the image sensing area, and a third side of the carrier area is connected to a third side of the image sensing chip. The lower surface of the filter element has a light transmitting area and a connecting area surrounding the light transmitting area. The first conductive area of the image sensing chip and the second conductive area are electrically and respectively connected to the first solder area and the second solder area of the circuit substrate, and the connecting area of the filter element corresponds to the carrier area of the image sensing chip.

In one aspect, the present disclosure provides another image capturing module, including a circuit substrate, an image sensing chip, a filter element, and a lens assembly. The circuit substrate has an upper surface and a lower surface. The image sensing chip is disposed on the upper surface of the circuit substrate. A filter element is disposed on the image sensing chip. The lens assembly includes a holder structure disposed on the circuit substrate and a lens structure disposed on the holder structure. The upper surface of the circuit substrate includes a chip placing area and a first solder area, and the first solder area is connected between a first side of the chip placing area and a first side of the circuit substrate. The upper surface of the image sensing chip includes an image sensing area, a carrier area, and a first conductive area. The first conductive area is connected between a first side of the carrier area and a first side of the image sensing chip, and the carrier area surrounds the image sensing area. The lower surface of the filter element has a light transmitting area and a connecting area surrounding the light transmitting area. The first conductive area of the image sensing chip is electrically connected to the first solder area of the circuit substrate, and the connecting area of the filter element corresponds to the carrier area of the image sensing chip.

Therefore, one of the beneficial effects of the present disclosure is that the image capturing module and the portable electronic device provided by the present disclosure can reduce the width or size of the image sensing chip in the horizontal direction by the technical features of "the upper surface of the circuit substrate including a chip placing area, a first solder area, and a second solder area; the first solder area connected between a first side of the chip placing area and a first side of the circuit substrate, the second solder area connected between a second side of the chip placing area and a second side of the circuit substrate and a third side of the chip placing area connected to a third side of the circuit substrate.", "the upper surface of the image sensing chip including an image sensing area, a carrier area, a first conductive area, and a second conductive area; the first conductive area connected between a first side of the carrier area and a first side of the image sensing chip, the second conductive area connected between a second side of the carrier area and a second side of the image sensing chip, the carrier area surrounding the image sensing area, and a third side of the carrier area connected to a third side of the image sensing chip.", "the lower surface of the filter element having a light transmitting area and a connecting area surrounding the light transmitting area." and "the first conductive area and the second conductive area of the image sensing chip electrically and respectively connected to the first solder area of the circuit substrate and the second solder area, and the connecting area of the filter element corresponding to the carrier area of the image sensing chip.".

Another beneficial effects of the present disclosure is that the image capturing module provided by the present disclosure can reduce the width or size of the image sensing chip in the horizontal direction by the technical features of "the upper surface of the circuit substrate including a chip placing area and a first solder area, and the first solder area connected between a first side of the chip placing area and a first side of the circuit substrate.", "the upper surface of the image sensing chip including an image sensing area, a carrier area, and a first conductive area; the first conductive area connected between a first side of the carrier area and a first side of the image sensing chip, and the carrier area surrounding the image sensing area.", "the lower surface of the filter element having a light transmitting area and a connecting area surrounding the light transmitting area." and "the first conductive area of the image sensing chip electrically connected to the first solder area of the circuit substrate, and the connecting area of the filter element corresponding to the carrier area of the image sensing chip.".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
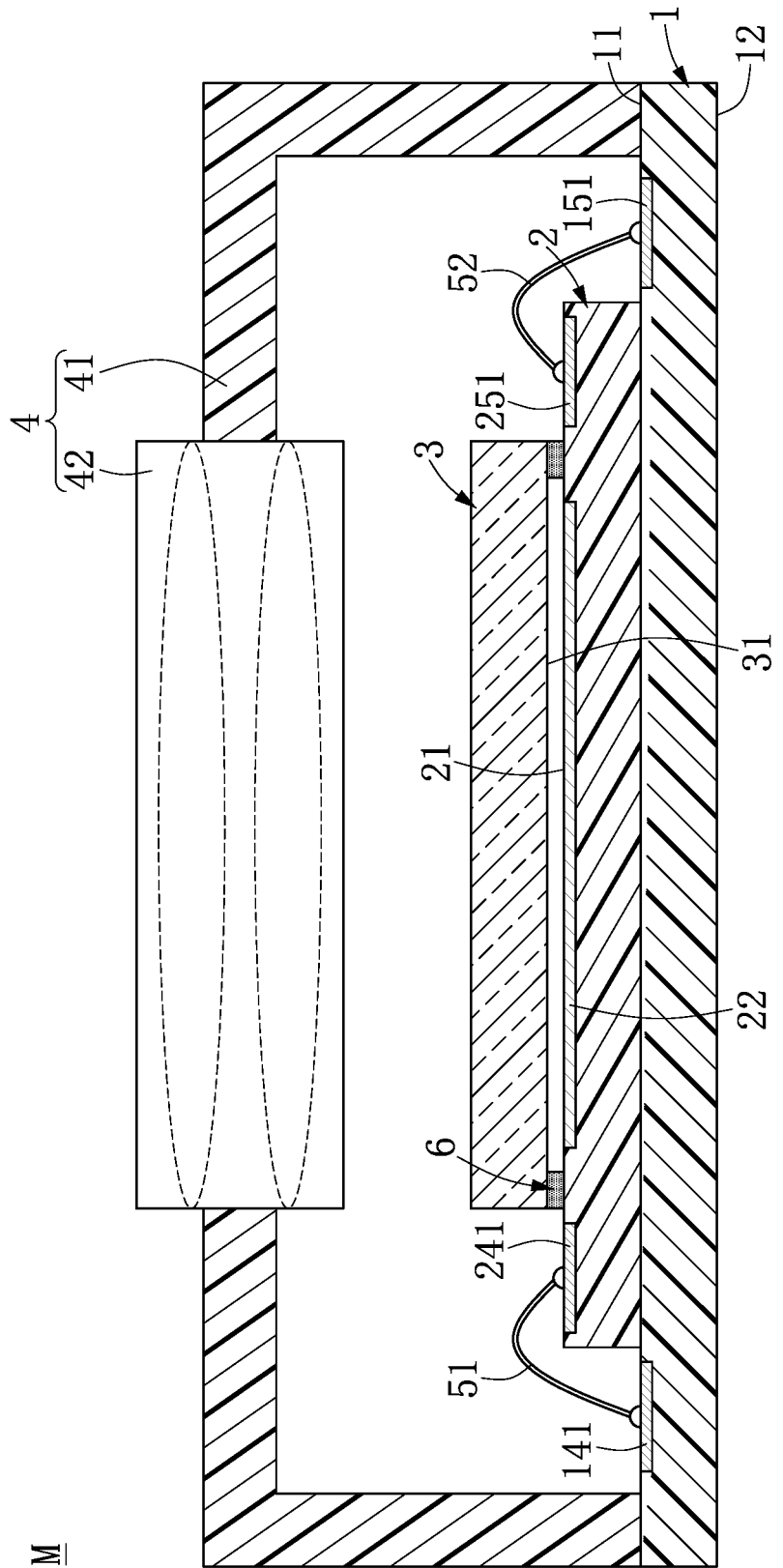
FIG. 1 is a cross-section view of an image capturing module according to a first embodiment of the present disclosure.
Figure 2:
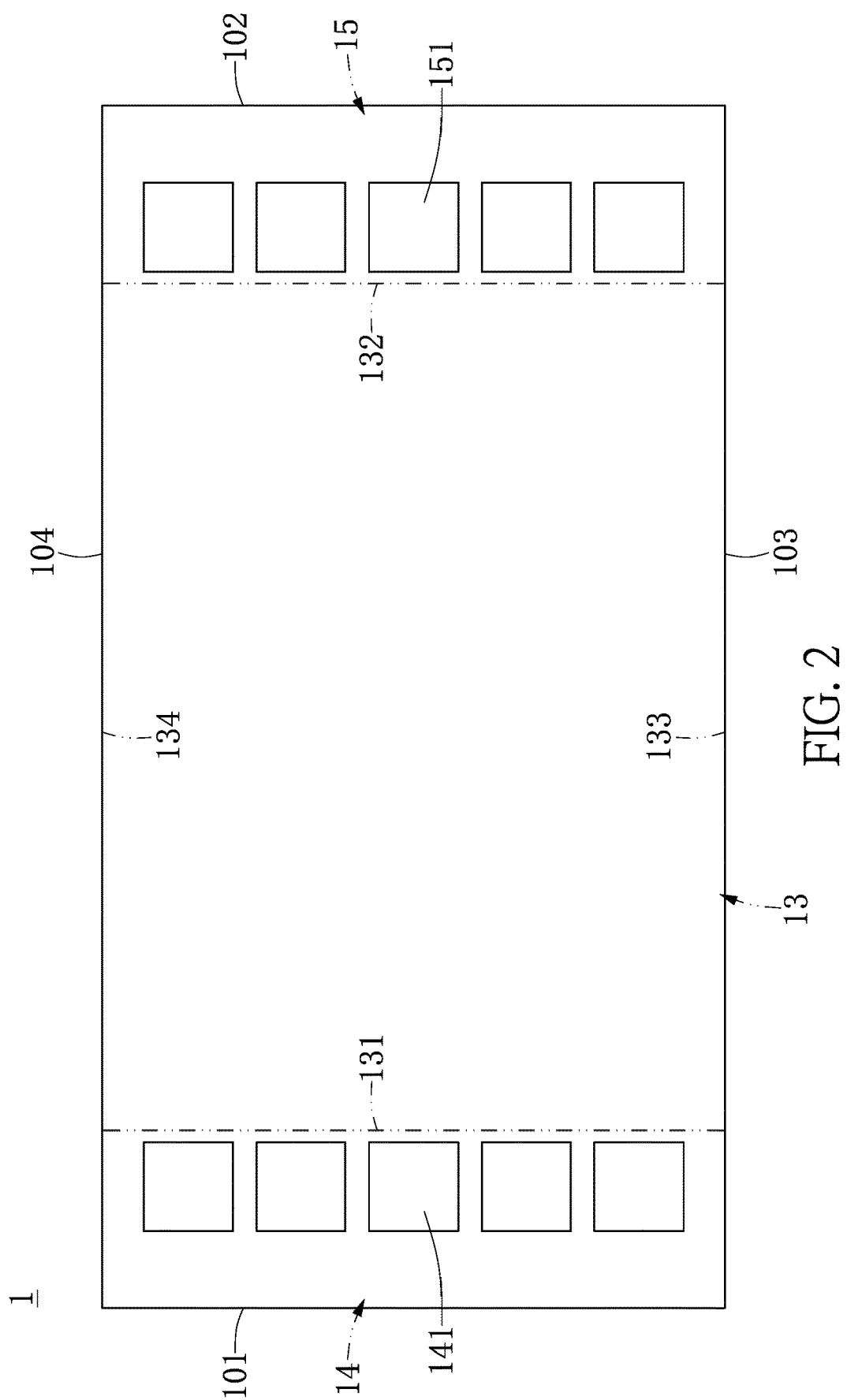
FIG. 2 is a top view of a circuit substrate according to the first embodiment of the present disclosure.
Figure 3:
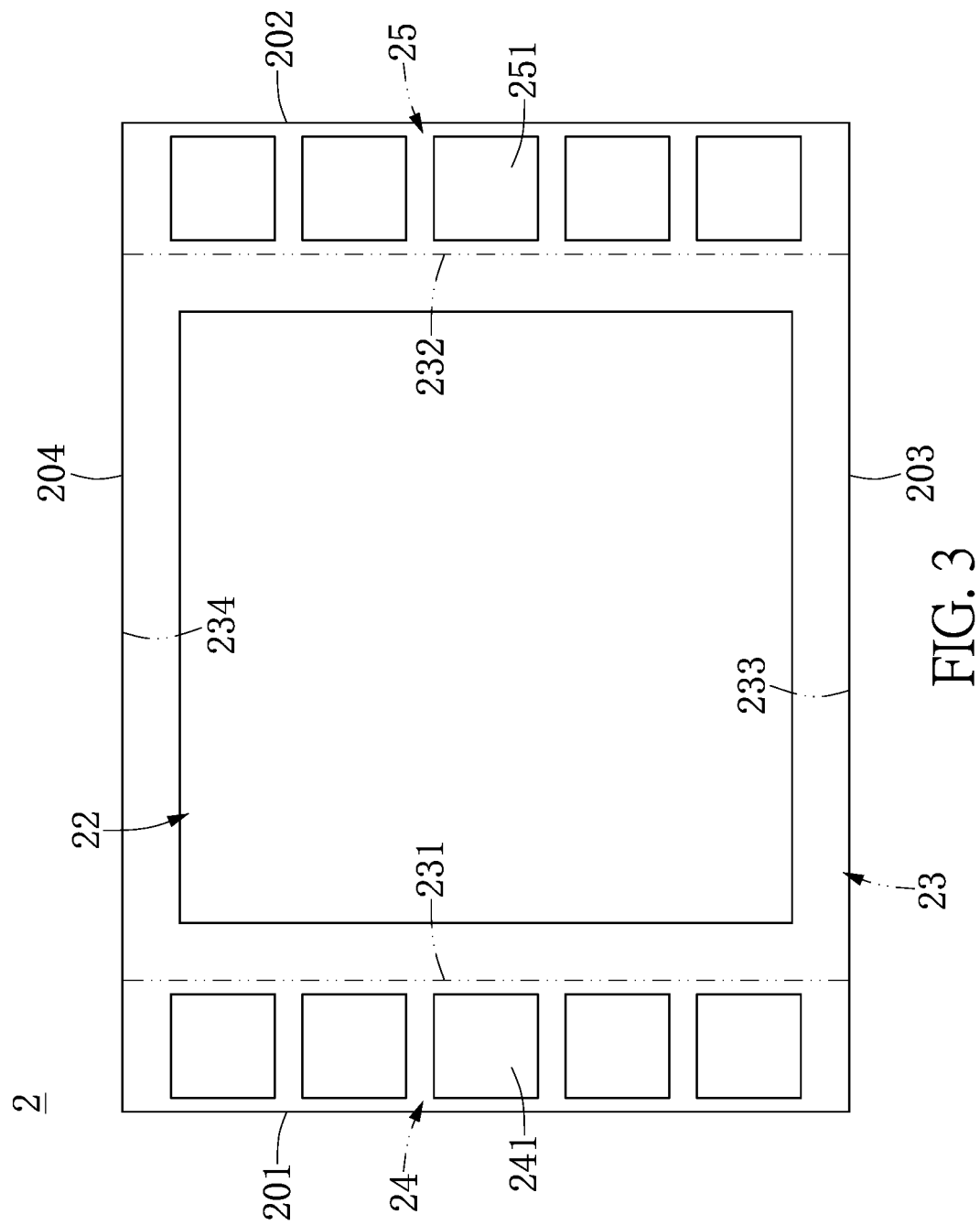
FIG. 3 is a top view of an image sensing chip according to the first embodiment of the present disclosure.
Figure 4:
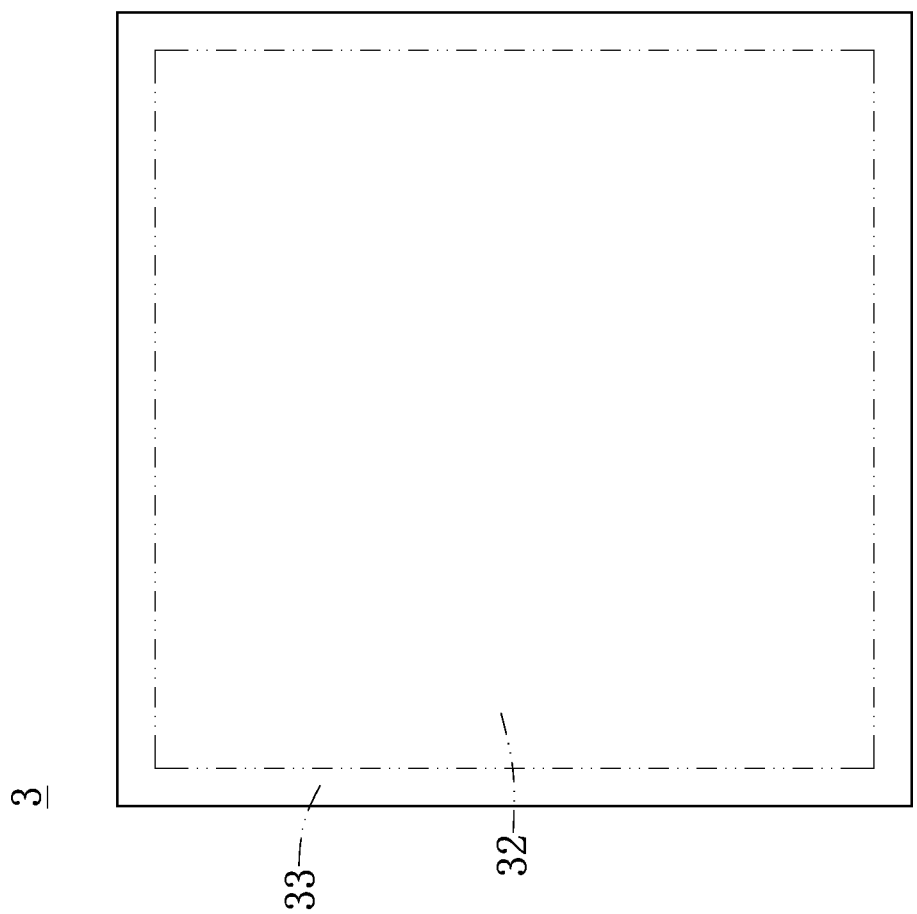
FIG. 4 is a top view of a filter element according to the first embodiment of the present disclosure.
Figure 5:
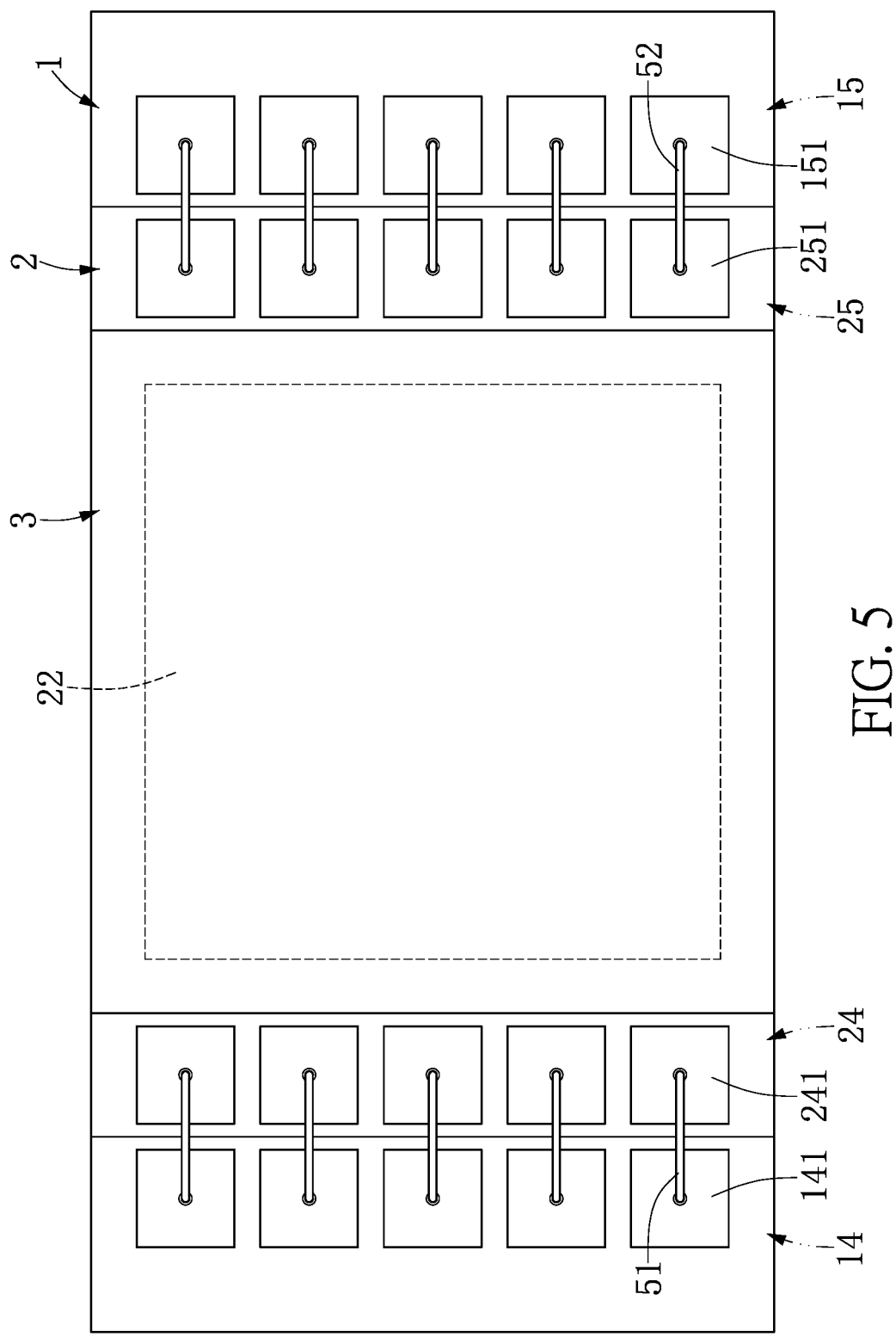
FIG. 5 is a front view after connecting the circuit substrate, the image sensing chip, and the filter element according to the first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure provides an image capturing module M, which includes a circuit substrate 1, an image sensing chip 2, a filter element 3, and a lens assembly 4.

Firstly, the circuit substrate 1 has an upper surface 11 and a lower surface 12. For example, the circuit substrate 1 may be a PCB hard board (such as BT, FR4, and FR5 material), a soft and hard bonding board or a ceramic substrate, etc., but the present disclosure is not limited thereto. Further, the upper surface 11 of the circuit substrate 1 includes a chip placing area 13, a first solder area 14, and a second solder area 15. The chip placing area 13 can be a solderless area. The first solder area 14 is connected between a first side 131 of the chip placing area 13 and a first side 101 of the circuit substrate 1, the second solder area 15 is connected between a second side 132 of the chip placing area 13 and a second side 102 of the circuit substrate 1, and a third side 133 of the chip placing area 13 is connected to a third side 103 of the circuit substrate 1.

Secondly, the image sensing chip 2 is disposed on the upper surface 11 of the circuit substrate 1. Further, the upper surface 21 of the image sensing chip 2 includes an image sensing area 22, a carrier area 23, a first conductive area 24, and a second conductive area 25. The first conductive area 24 is connected between a first side 231 of the carrier area 23 and a first side 201 of the image sensing chip 2, the second conductive area 25 is connected between a second side 232 of the carrier area 23 and a second side 202 of the image sensing chip 2, the carrier area 23 surrounds the image sensing area 22 and a third side 233 of the carrier area 23 is connected to a third side 203 of the image sensing chip 2. For example, the image sensing chip 2 can be a complementary metal oxide semiconductor (CMOS) sensor or any sensor with an image capturing function, but the present disclosure is not limited thereto.

Therefore, the image sensing chip 2 can be electrically and respectively connected to the first solder area 14 and the second solder area 15 of the circuit substrate 1 through the first conductive area 24 and the second conductive area 25.

The image capturing module M further includes a filter element 3 disposed on the image sensing chip 2. For example, the filter element 3 can be directly disposed on the image sensing chip 2 by an adhesive (as shown in FIG. 1), or the filter element 3 can be disposed above the image sensing chip 2 by a plurality of pillars (not shown). In addition, the filter element 3 may be a coated glass or a non-coated glass, but the present disclosure is not limited thereto. Further, the lower surface 31 of the filter element 3 has a light transmitting area 32 and a connecting area 33 surrounding the light transmitting area 32, and the connecting area 33 of the filter element 3 corresponds to the carrier area 23 of the image sensing chip 2. An adhesive 6 is disposed between the carrier area 23 and the connecting area 33, so that the filter element 3 is disposed on the carrier area 23 of the image sensing chip 2 by the adhesive 6. For example, the adhesive 6 may be an adhesive made of epoxy or silicone, or may be a UV glue, a thermoset adhesive or an AB glue, but the present disclosure is not limited thereto.

In addition, the image capturing module M further includes a lens assembly 4 which includes a holder structure 41 disposed on the circuit substrate 1 and a lens structure 42 disposed on the holder structure 41. For example, the holder structure 41 may be a common base or any kind of voice coil motor (VCM), and the lens structure 42 may be composed of a plurality of lenses, corresponds to the image sensing area 22, and may be fixedly or movably disposed on the non-holder structure 41 according to different usage requirements, but the present disclosure is not limited thereto. In addition, the holder structure 41 may be disposed on the upper surface 101 of the circuit substrate 1 by an adhesive (not shown), but the present disclosure is not limited thereto.

In summary, two sides of the circuit substrate 1 and the image sensing chip 2 can be electrically connected to each other by disposing the first solder area 14, the second solder area 15, the first conductive area 24 and the second conductive area 25. Therefore, the width or size in the horizontal direction of the other two sides of the circuit substrate 1 and the image sensing chip 2 can be reduced. That is, since the solder area and the conductive area can be omitted on the other two sides of the circuit substrate 1 and the image sensing chip 2, the width of the circuit substrate 1 and the image sensing chip 2 in the horizontal direction (X direction) can be reduced. Thereby, the size of the image sensing chip 2 in the horizontal direction is reduced.

Further, the first solder area 14 includes a plurality of first solder pads 151, the second solder area 15 includes a plurality of first solder pads 151, the first conductive area 24 includes a plurality of first conductive parts 241 electrically connected to the first solder pads 151 by respectively passing through a plurality of second conducting wires 251, and the second conductive area 25 includes a plurality of second conductive parts 251 electrically connected to the second solder pads 151 by respectively passing through a plurality of second conducting wires 52. The first solder area 14 is disposed opposite to the second solder area 15. For example, a plurality of first solder pads 141 may be disposed on the first solder area 14 of the circuit substrate 1, a plurality of second solder pads 151 may be disposed on the second solder area 15. In contrast, a plurality of first conductive parts 241 may be disposed on the first conductive area 24 of the image sensing chip 2 and a plurality of second conductive parts 251 may be disposed on the second conductive area 25. Therefore, the plurality of first conductive parts 241 of the image sensing chip 2 are electrically connected to the plurality of first solder pads 141 by respectively passing through the plurality of first conducting wires 51, and the plurality of second conductive parts 251 are electrically connected to the plurality of second solder pads 151 by respectively passing through a plurality of second conducting wires 52.

It is worth mentioning that a fourth side 134 of the chip placing area 13 of the circuit substrate 1 is connected to a fourth side 104 of the circuit substrate 1, and a fourth side 234 of the carrier area 23 is connected to a fourth side 204 of the image sensing chip 2. The first side 101 of the circuit substrate 1 is disposed opposite to the second side 102, and the third side 103 of the circuit substrate 1 is disposed opposite to the fourth side 104. The first side 131 of the chip placing area 13 is disposed opposite to the second side 132, and the third side 133 of the chip placing area 13 is disposed opposite to the fourth side 134. The first side 201 of the image sensing chip 2 is disposed opposite to the second side 202, and the third side 203 of the image sensing chip 2 is disposed opposite to the fourth side 204. The first side 231 of the carrier area 23 is disposed opposite to the second side 232, and the third side 233 of the carrier area 23 is disposed opposite to the fourth side 234. For example, the fourth side 134 of the chip placing area 13 overlaps the fourth side 104 of the circuit substrate 1, and the fourth side 234 of the carrier area 23 connects and overlaps to the fourth side 204 of the image sensing chip 2.

However, the above-mentioned embodiment is for exemplary purpose only and the present disclosure is not limited thereto.

Second Embodiment

Figure 6:
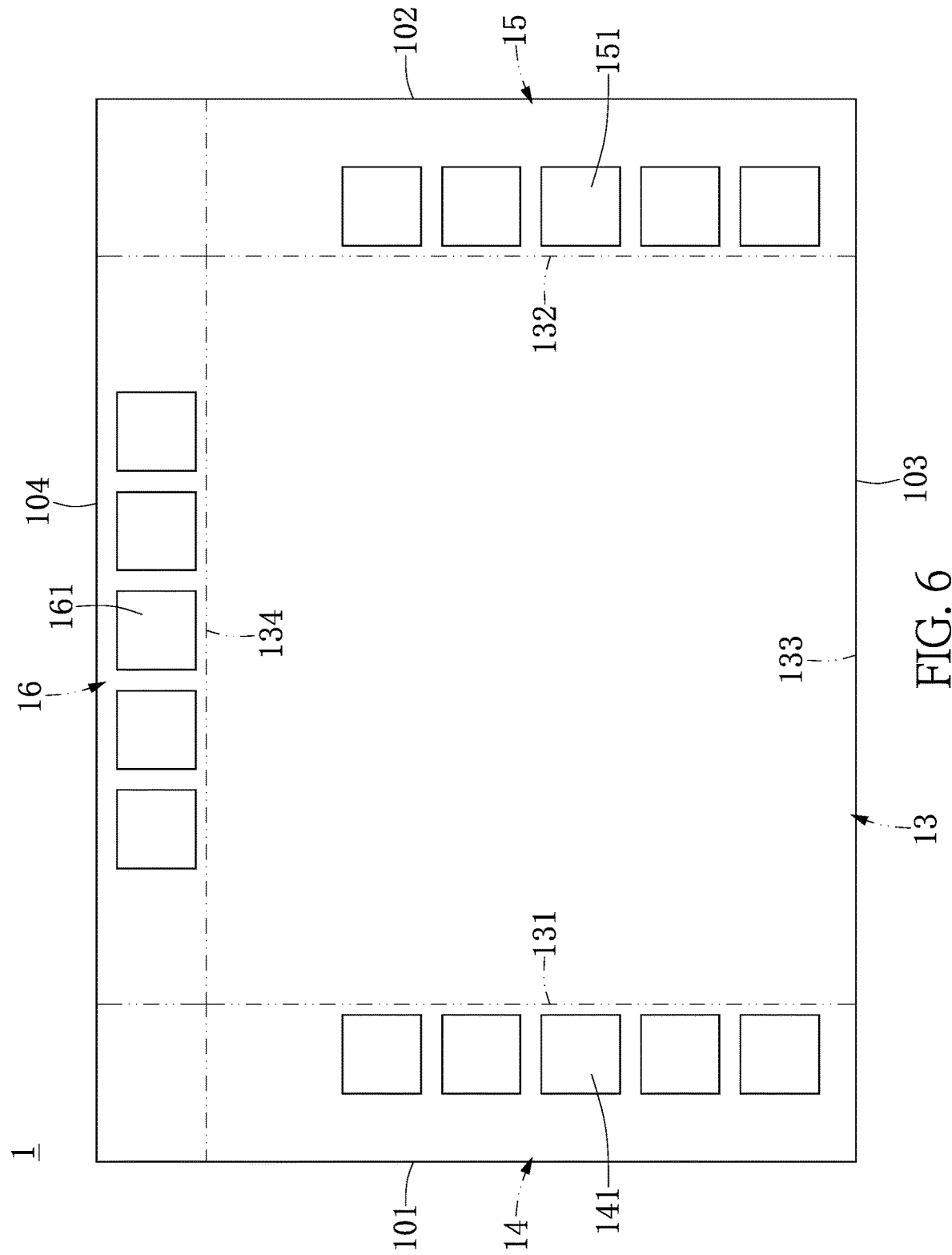
FIG. 6 is a top view of a circuit substrate according to a second embodiment of the present disclosure.
Figure 7:
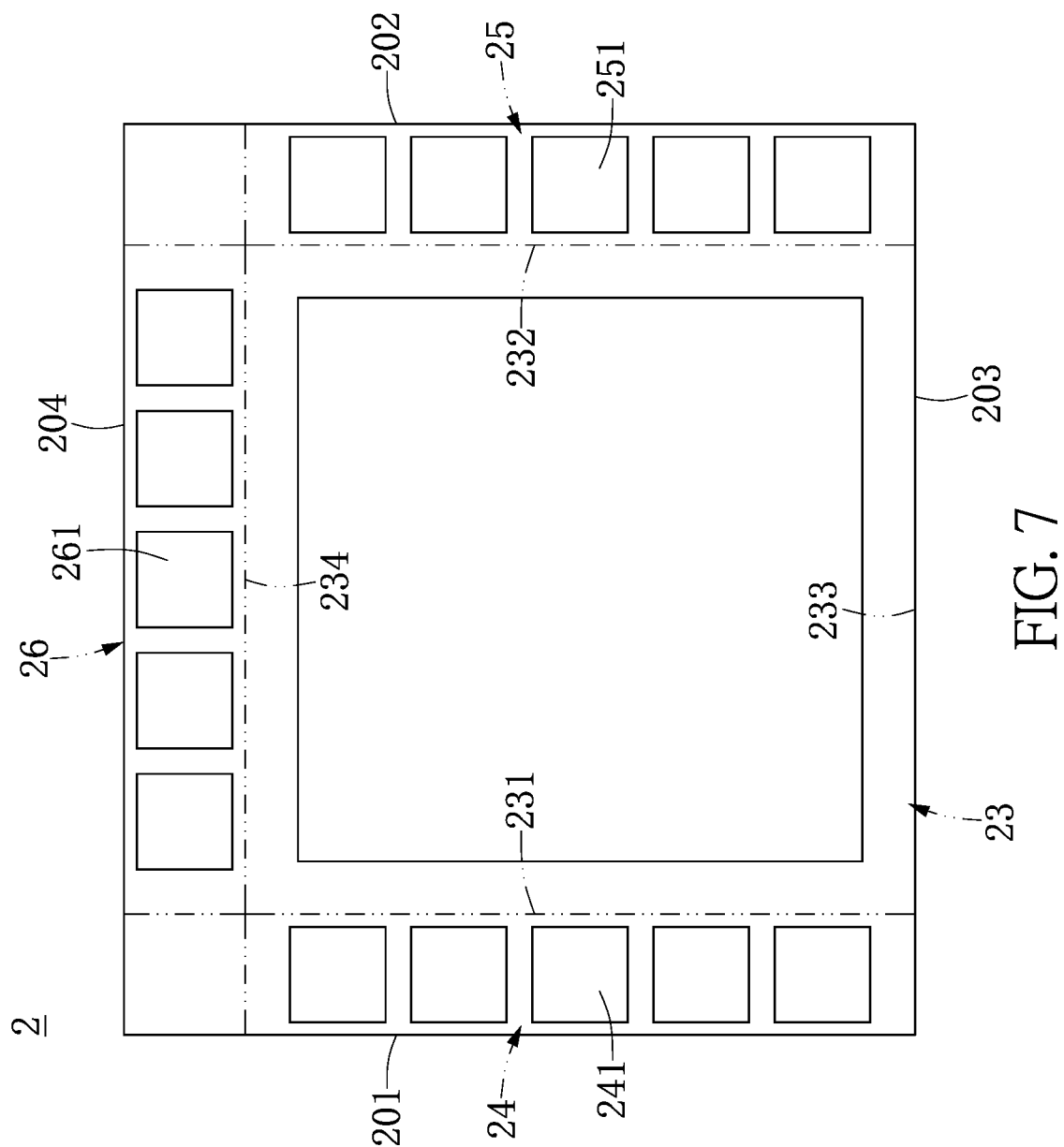
FIG. 7 is a top view of an image sensing chip according to the second embodiment of the present disclosure.
Figure 8:
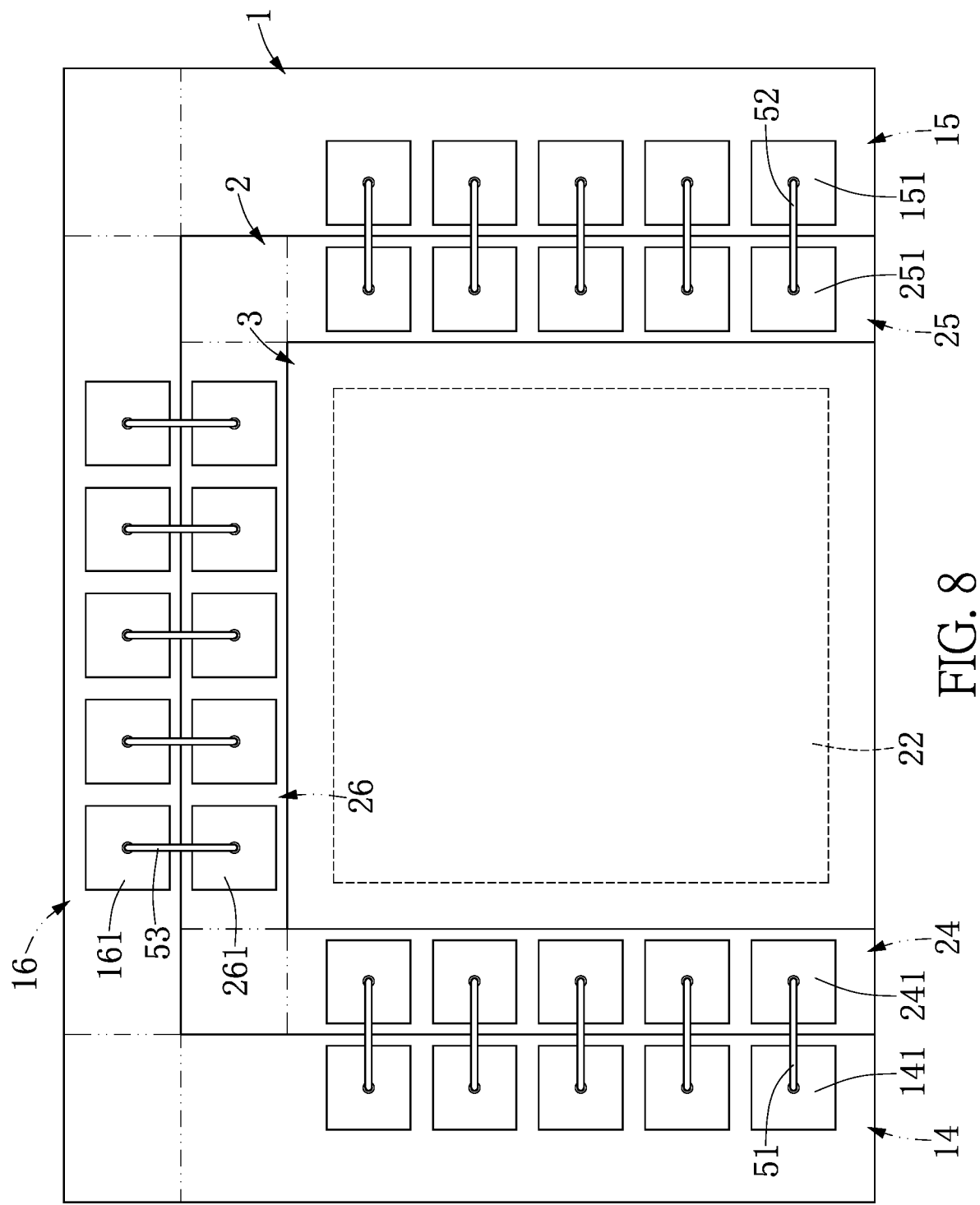
FIG. 8 is a front view after connecting the circuit substrate and the image sensing chip according to the second embodiment of the present disclosure.
Figure 9:
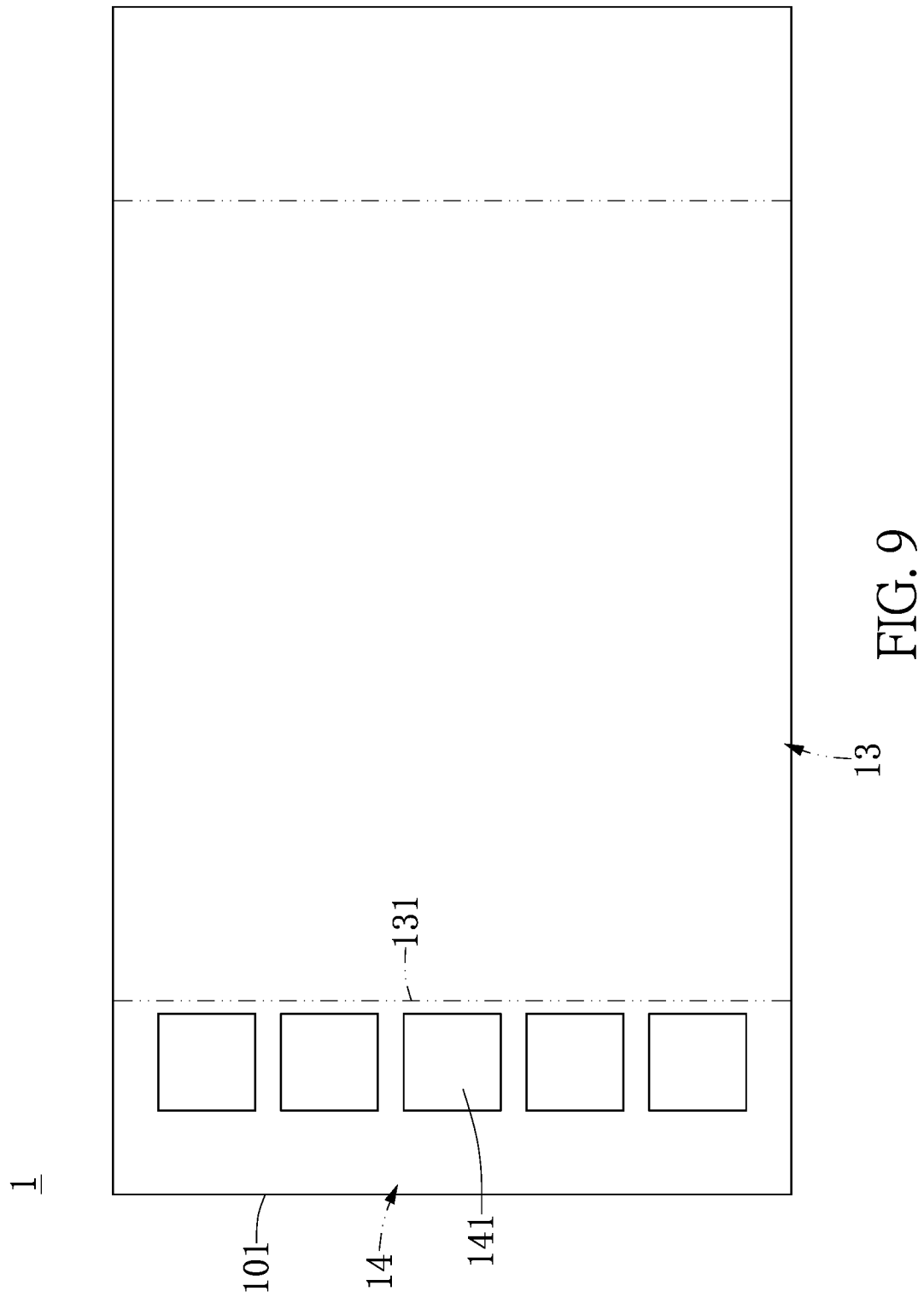
FIG. 9 is a first top view of a circuit substrate according to a third embodiment of the present disclosure.
Figure 10:
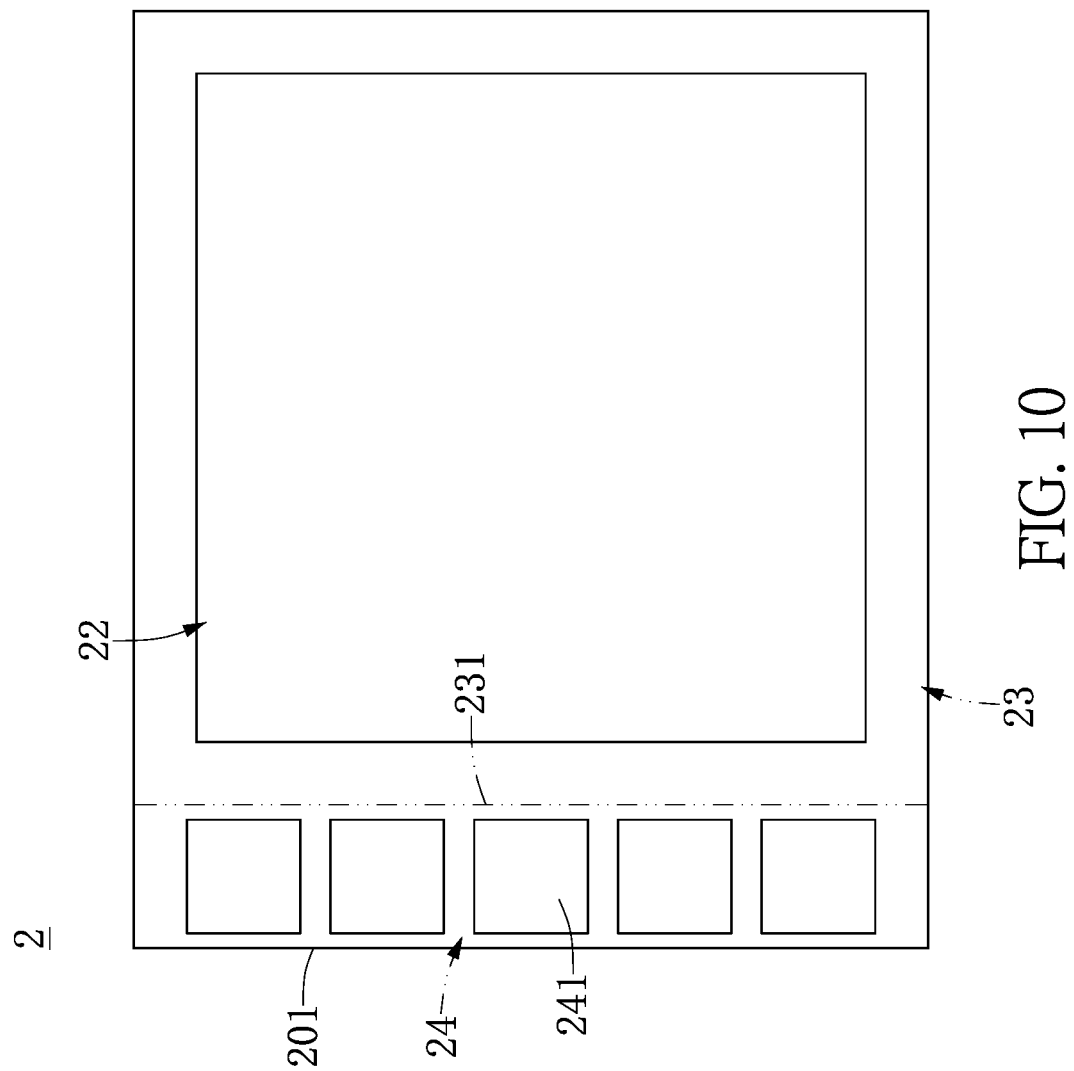
FIG. 10 is a second top view of an image sensing chip according to the third embodiment of the present disclosure.
Figure 11:
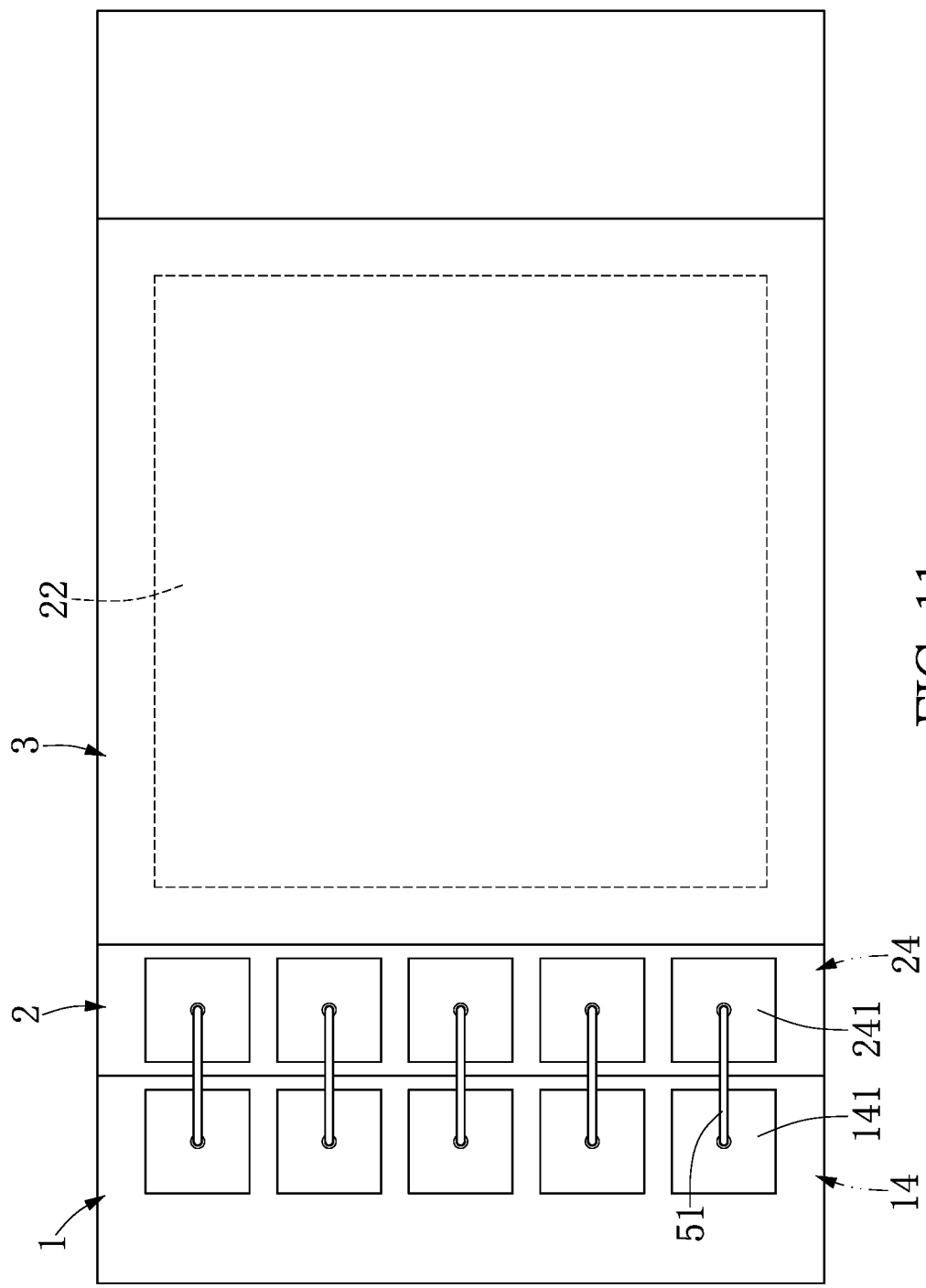
FIG. 11 is a first front view after connecting the circuit substrate and the image sensing chip according to the third embodiment of the present disclosure.

Referring to FIG. 6 to FIG. 8, a second embodiment of the present disclosure provides an image capturing module M, which includes a circuit substrate 1, an image sensing chip 2, a filter element 3, and a lens assembly 4. Comparing FIG. 6, 7, 8 with FIG. 2, 3, 5, the biggest difference between the second embodiment and the first embodiment of the present disclosure is that, the upper surface 11 of the circuit substrate 1 includes a third solder area 16, and the third solder area 16 connected between a fourth side 104 of the chip placing area 13 and a fourth side 104 of the circuit substrate 1. The upper surface 21 of the image sensing chip 2 includes a third conductive area 26 connected between a fourth side 234 of the carrier area 23 and a fourth side 204 of the image sensing chip 2. The first conductive area 24 and the second conductive area 25 of the image sensing chip 2 are electrically and respectively connected to the first solder area 14 and the second solder area 15 of the circuit substrate 1.

For example, the present disclosure can provide a third solder area 16 disposed between the fourth side 104 of the chip placing area 13 and the fourth side 104 of the circuit substrate 1 according to different design requirements, and the image sensing chip 2 corresponds to a third conductive area 26 disposed between the fourth side 234 of the carrier area 23 and the fourth side 204 of the image sensing chip 2. Furthermore, a plurality of third solder pads 161 may be disposed on the third solder area 16, and a plurality of third conductive parts 261 may be disposed on the third conductive area 26 of the image sensing chip 2. Therefore, the plurality of third conductive parts 261 of the image sensing chip 2 are electrically connected to the plurality of third solder pads 161 by relatively passing through the plurality of third conducting wires 53.

However, the above-mentioned embodiment is for exemplary purpose only and the present disclosure is not limited thereto.

Third Embodiment

Referring to FIG. 9 to FIG. 14, a second embodiment of the present disclosure provides an image capturing module M, which includes a circuit substrate 1, an image sensing chip 2, a filter element 3, and a lens assembly 4. Comparing FIG. 9, 10, 11 with FIG. 2, 3, 5, the biggest difference between the third embodiment and the first embodiment of the present disclosure is that, the upper surface 11 of the circuit substrate 1 includes a chip placing area 13 and a first solder area 14 connected between a first side 131 of the chip placing area 13 and a first side 101 of the circuit substrate 1. The upper surface 21 of the image sensing chip 2 includes an image sensing area 22, a carrier area 23, and a first conductive area 24. The first conductive area 24 is connected between a first side 231 of the carrier area 23 and a first side 201 of the image sensing chip 2, and the carrier area 23 surrounds the image sensing area 22. The first conductive area 24 of the image sensing chip 2 is electrically connected to the first solder area 14 of the circuit substrate 1. The first solder area 14 includes a plurality of first solder pads 141, and the first conductive portion 241 includes a plurality of first conductive parts 241 electrically connected to the first solder pads 141 by respectively passing through a plurality of first conducting wires 51.

For example, the present disclosure can provide a first solder area 14 disposed between the first side 131 of the chip placing area 13 and the first side 101 of the circuit substrate 1 according to different design requirements, and the first conductive area corresponding to the first solder area 14 is disposed between the first side 231 of the carrier area 23 and the first side 201 of the image sensing chip 2. In other words, the image capturing module M of the present disclosure can be provided with a solder area disposed on one side of the circuit substrate 1 and a conductive area relatively disposed on one side of the image sensing chip 2 to electrically connect the circuit substrate 1 and the image sensing chip 2, thereby the width or size of the at least two sides of the circuit substrate 1 and the image sensing chip 2 in the horizontal direction can be reduced.

Figure 12:
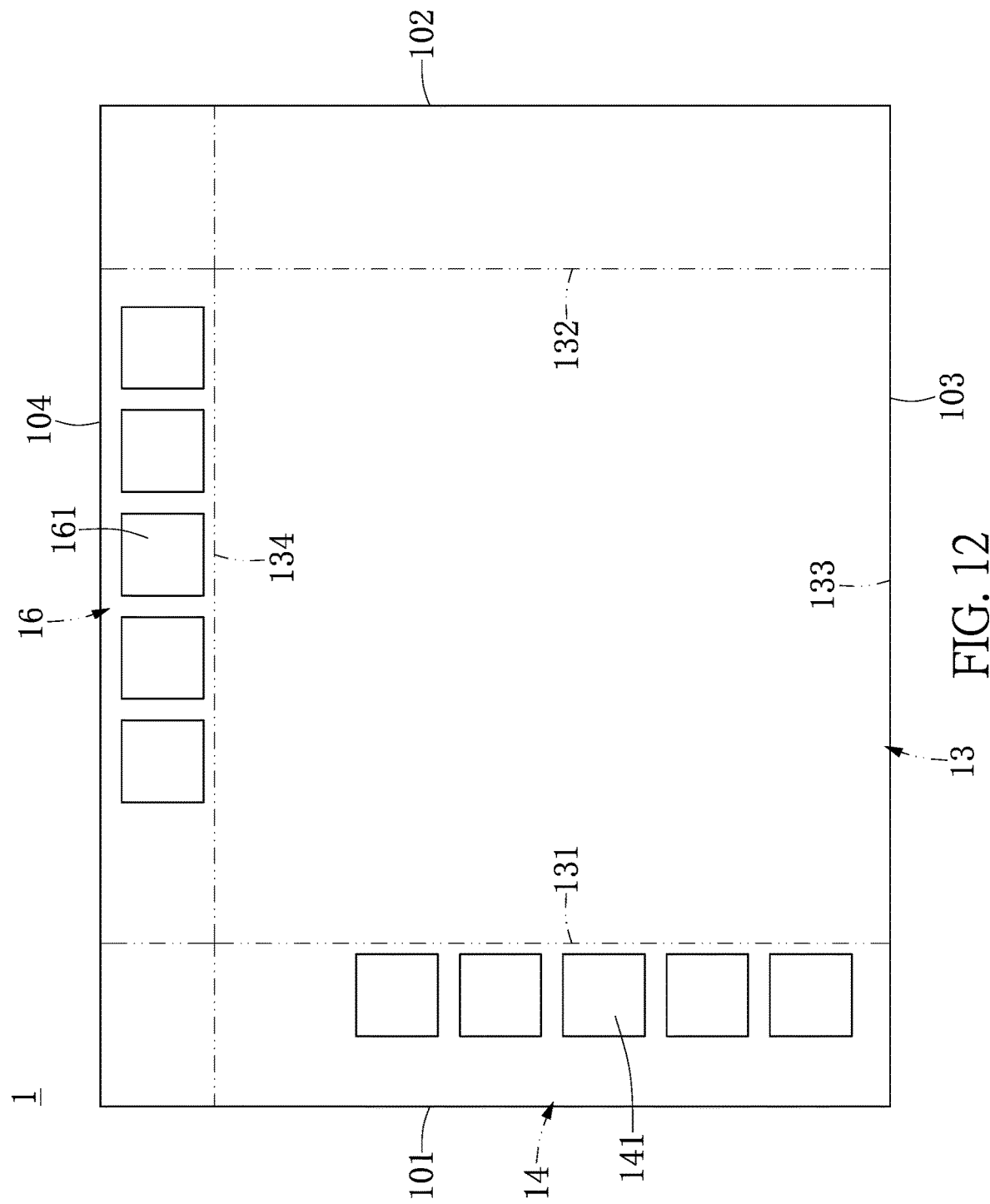
FIG. 12 is a second top view of the circuit substrate according to the third embodiment of the present disclosure.
Figure 13:
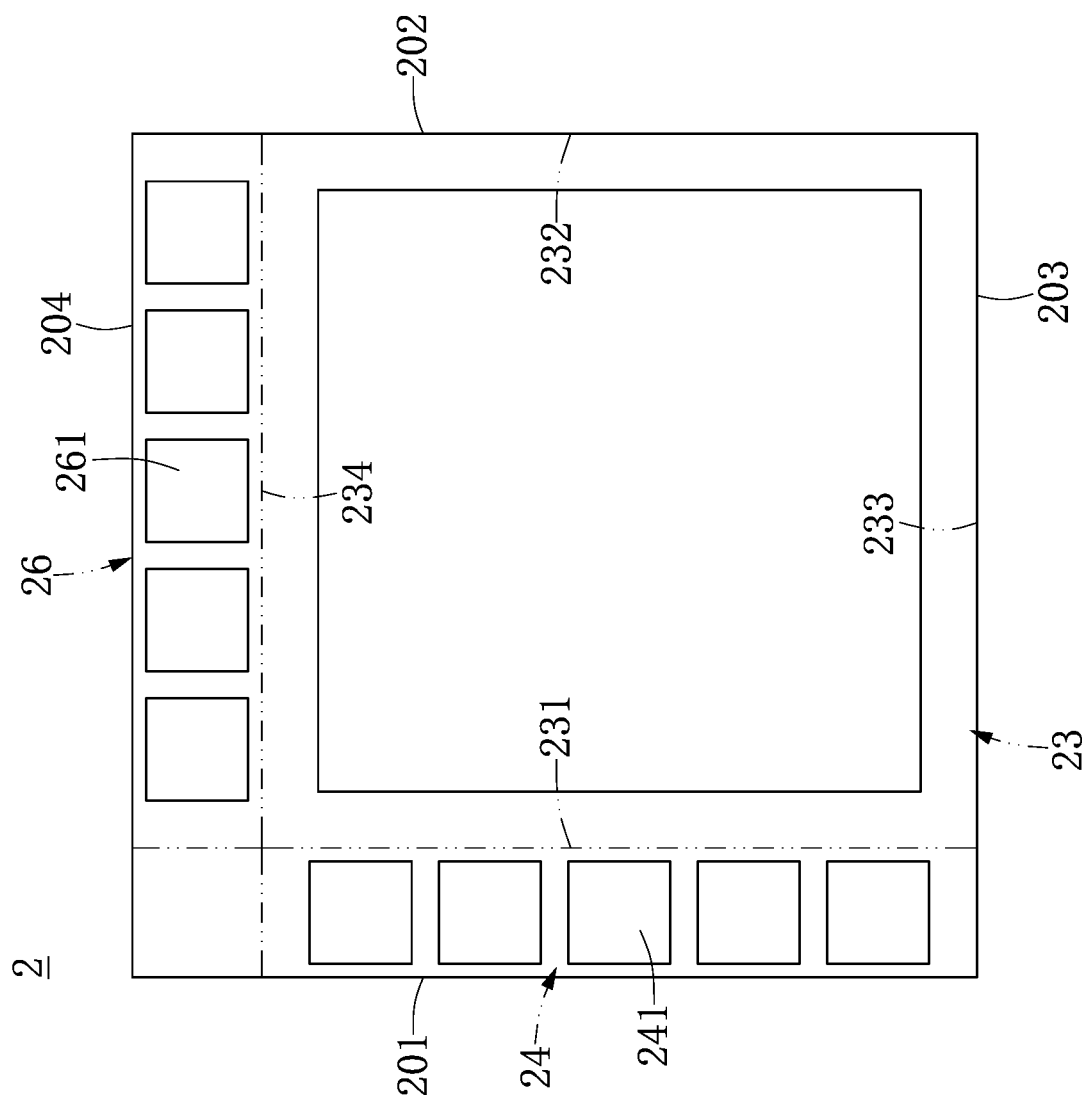
FIG. 13 is a second top view of the image sensing chip according to the third embodiment of the present disclosure.
Figure 14:
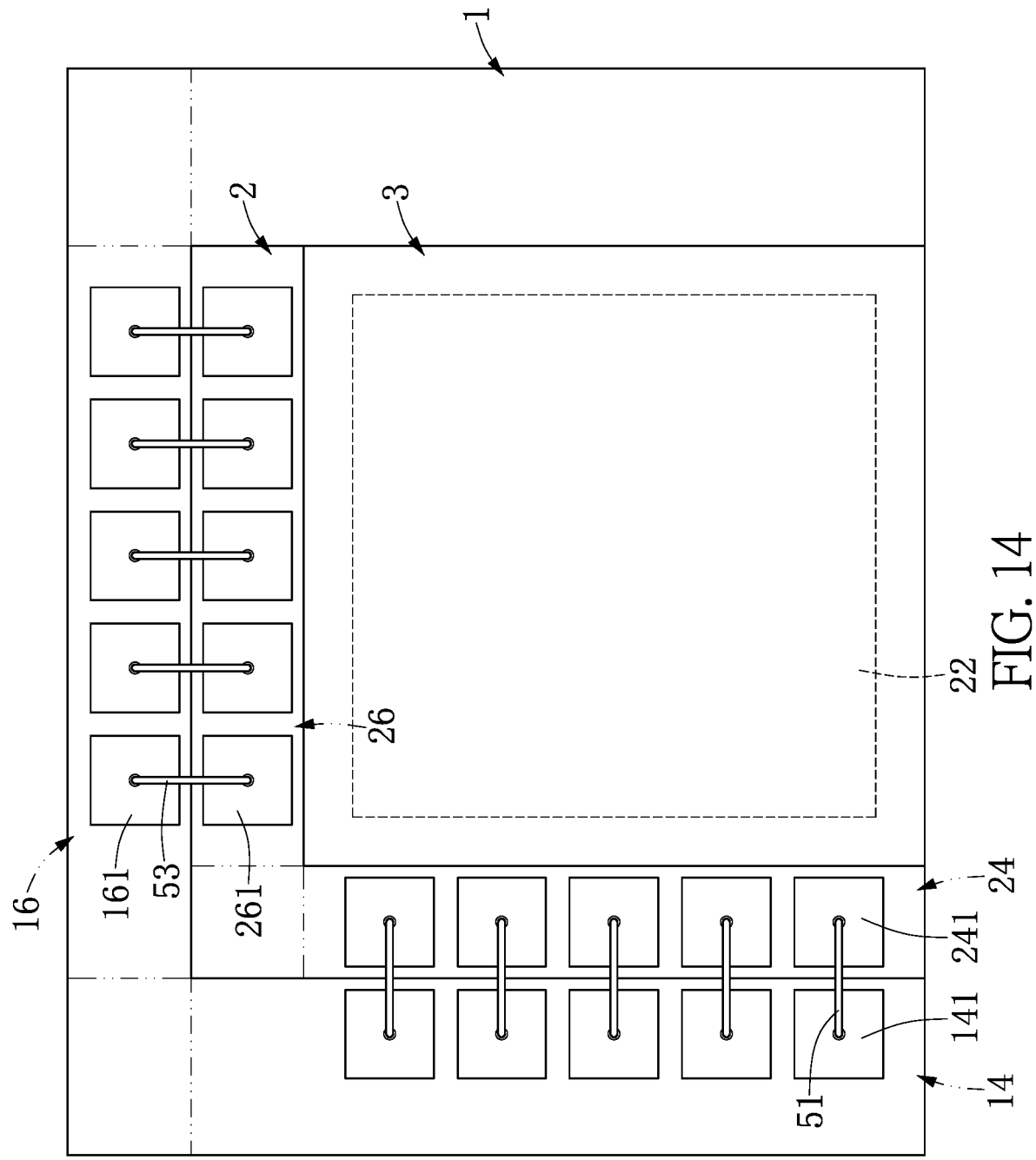
FIG. 14 is a second front view after connecting the circuit substrate and the image sensing chip according to the third embodiment of the present disclosure.
Figure 15:
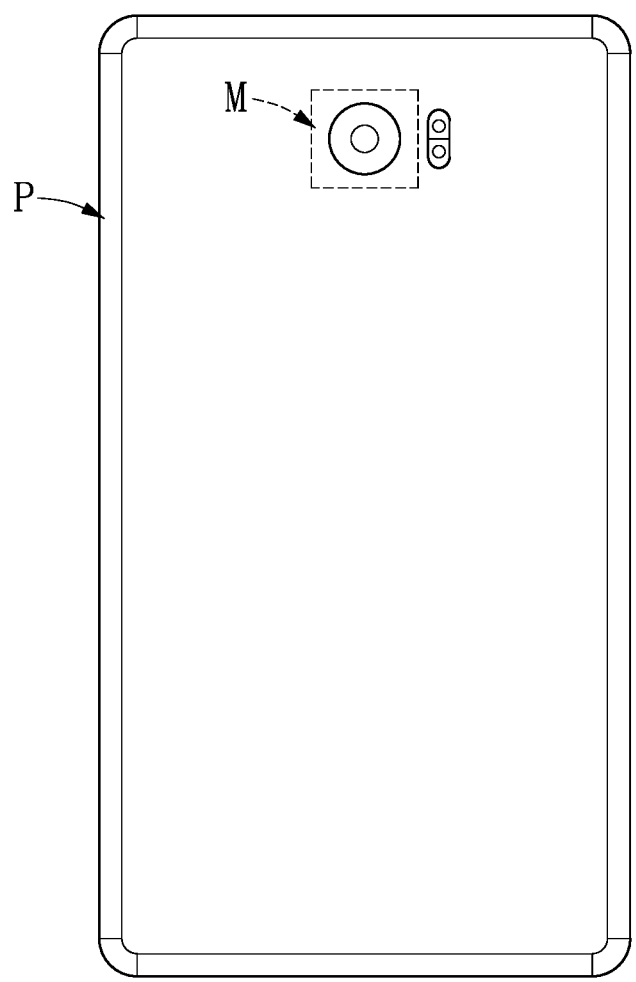
FIG. 15 is a schematic view of a portable electronic device according to a fourth embodiment of the present disclosure.

Further, another configurations of the image capturing module M of the third embodiment of the present disclosure refers to FIG. 12 to FIG. 14. Furthermore, the image sensing chip 2 of the image capturing module M of the third embodiment of the present disclosure can be designed as an eccentricity. For example, the upper surface 11 of the circuit substrate 1 of the image capturing module M includes a third solder area 16 connected between a fourth side 104 of the chip placing area 13 and a fourth side 104 of the circuit substrate 1; relatively, the upper surface 21 of the image sensing chip 2 includes a third conductive area 26 connected between a fourth side 234 of the carrier area 23 and a fourth side 204 of the image sensing chip 2. A plurality of third solder pads 161 may be disposed on the third solder area 16, and a plurality of third conductive parts 261 may be disposed on the third conductive area 26 of the image sensing chip 2. Therefore, the plurality of third conductive parts 261 of the image sensing chip 2 are electrically connected to the plurality of third solder pads 161 by respectively passing through the plurality of third conducting wires 53.

However, the above-mentioned embodiment is for exemplary purpose only and the present disclosure is not limited thereto.

Fourth Embodiment

Referring to FIG. 15 and FIG. 1 to FIG. 14, a fourth embodiment of the present disclosure provides a portable electronic device Z, which includes a portable electronic module P and an image capturing module M. The image capturing module M is disposed on the portable electronic module, and the image capturing module M includes a circuit substrate 1, an image sensing chip 2, a filter element 3, and a lens assembly 4. For example, the portable electronic module P may be a mobile phone, a notebook computer or a tablet computer, but the present disclosure is not limited thereto; moreover, any one of the image capturing module M in the first to fourth embodiments may be installed in the portable electronic module P, so that the electronic module P can perform image capturing through the image capturing module M. However, the above-mentioned embodiment is for exemplary purpose only and is not intended to limit the disclosure.

In conclusion, one of the beneficial effects of the present disclosure is that the image capturing module and the portable electronic device provided by the present disclosure can reduce the width or size of the image sensing chip in the horizontal direction by the technical features of "the upper surface 11 of the circuit substrate 1 including a chip placing area 13, a first solder area 14, and a second solder area 15; the chip placing area 13 being a solderless area; the first solder area 14 connected between a first side 131 of the chip placing area 13 and a first side 101 of the circuit substrate 1, the second solder area 15 connected between a second side 132 of the chip placing area 13 and a second side 102 of the circuit substrate 1, and a third side 133 of the chip placing area 13 connected to a third side 103 of the circuit substrate 1.", "the upper surface 21 of the image sensing chip 2 including an image sensing area 22, a carrier area 23, a first conductive area 24, and a second conductive area 25; the first conductive area 24 connected between a first side 231 of the carrier area 23 and a first side 201 of the image sensing chip 2, the second conductive area 25 connected between a second side 232 of the carrier area 23 and a second side 202 of the image sensing chip 2, the carrier area 23 surrounding the image sensing area 22, and a third side 233 of the carrier area 23 connected to a third side 203 of the image sensing chip 2.", "the lower surface 31 of the filter element 3 having a light transmitting area 32 and a connecting area 33 surrounding the light transmitting area 32." and "the first conductive area 24 and the second conductive area 25 electrically and respectively connected to the first solder area 14 and the second solder area 15 of the circuit substrate 1, and the connecting area 33 of the filter element 3 corresponding to the carrier area 23 of the image sensing chip 2.".

Another beneficial effect of the present disclosure is that, the image capturing module provided by the present disclosure can reduce the width or size of the image sensing chip in the horizontal direction by the technical features of "the upper surface 11 of the circuit substrate 1 including a chip placing area 13 and a first solder area 14 connected between a first side 131 of the chip placing area 13 and a first side 101 of the circuit substrate 1.", "the upper surface 21 of the image sensing chip 2 including an image sensing area 22, a carrier area 23, and a first conductive area 24; the first conductive area 24 connected between a first side 231 of the carrier area 23 and a first side 201 of the image sensing chip 2, and the carrier area 23 surrounding the image sensing area 22.", "the lower surface 31 of the filter element 3 having a light transmitting area 32 and a connecting area 33 surrounding the light transmitting area 32." and "the first conductive area 24 of the image sensing chip 2 electrically connected to the first solder area 14 of the circuit substrate 1, and the connecting area 33 of the filter element 3 corresponding to the carrier area 23 of the image sensing chip 2.".

Furthermore, compared with the related art, the image capturing module M and the portable electronic device Z of the present disclosure have the circuit substrate 1 and the image sensing chip 2 electrically connected to each other by the first solder area 14 and the first conductive area 24 on at least one side of the circuit substrate 1 and the image sensing chip 2 so as to electrically connect the circuit substrate 1 and the image sensing chip 2. Therefore, the width or size in the horizontal direction of the circuit substrate 1 and at least two sides of the image sensing chip 2 can be reduced. That is, since the at least one side of the circuit substrate 1 and the image sensing chip 2 can omit the disposed of the solder area and the conductive area, the width of the circuit substrate 1 and the image sensing chip 2 in the horizontal direction (X direction) can be reduced. Thereby, the size of the image sensing chip 2 in the horizontal direction can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An image capturing module, comprising:
a circuit substrate including an upper surface and a lower surface;
an image sensing chip disposed on the upper surface of the circuit substrate;
a filter element disposed on the image sensing chip; and
a lens assembly comprising a holder structure disposed on the circuit substrate and a lens structure disposed on the holder structure;
wherein the upper surface of the circuit substrate includes a chip placing area, a first solder area, and a second solder area; the first solder area is connected between a first side of the chip placing area and a first side of the circuit substrate, the second solder area is connected between a second side of the chip placing area and a second side of the circuit substrate, and a third side of the chip placing area is connected to a third side of the circuit substrate;
wherein the upper surface of the image sensing chip includes an image sensing area, a carrier area, a first conductive area and a second conductive area; the first conductive area is connected between a first side of the carrier area and a first side of the image sensing chip, the second conductive area is connected between a second side of the carrier area and a second side of the image sensing chip, the carrier area surrounds the image sensing area, and a third side of the carrier area is connected to a third side of the image sensing chip;
wherein the lower surface of the filter element has a light transmitting area and a connecting area surrounding the light transmitting area;
wherein the first conductive area and the second conductive of the image sensing chip area are electrically and respectively connected to the first solder area and the second solder area of the circuit substrate, and the connecting area of the filter element corresponds to the carrier area of the image sensing chip.

2. The image capturing module according to claim 1, wherein the first solder area includes a plurality of first solder pads, and the second solder area includes a plurality of second solder pads; the first conductive area includes a plurality of first conductive parts electrically connected to the first solder pads by respectively passing through a plurality of first conducting wires, and the second conductive part includes a plurality of second conductive parts electrically connected to the pads by respectively passing through a plurality of second conducting wires; wherein, the first solder area is disposed opposite to the second solder area, and an adhesive is disposed between the carrier area and the connecting area, so that the filter element is disposed on the carrier area of the image sensing chip by the adhesive.

3. The image capturing module according to claim 1, wherein a fourth side of the chip placing area is connected to a fourth side of the circuit substrate, and a fourth side of the carrier area is connected to a fourth side of the image sensing chip; wherein the first side of the circuit substrate is opposite to the second side, and the third side of the circuit substrate is opposite to the fourth side; wherein the first side of the chip placing area is opposite to the second side, and the third side of the chip placing area is opposite to the fourth side; wherein the first side of the image sensing chip is opposite to the second side, and the third side of the image sensing chip is opposite to the fourth side; wherein first side of the carrier area is opposite to the second side, and the third side of the carrier area is opposite to the fourth side.

4. The image capturing module according to claim 1, wherein the upper surface of the circuit substrate includes a third solder area, and the third solder area is connected between a fourth side of the chip placing area and a fourth side of the circuit substrate; wherein the upper surface of the image sensing chip includes a third conductive area, and the third conductive area is connected between a fourth side of the carrier area and a fourth side of the image sensing chip; wherein the first conductive area of the image sensing chip and the second conductive area are electrically and respectively connected to the first solder area and the second solder area of the circuit substrate.

5. A portable electronic device, comprising:
a portable electronic module; and
an image capturing module disposed on the portable electronic module, and the image capturing module including:
a circuit substrate including an upper surface and a lower surface;
an image sensing chip disposed on the upper surface of the circuit substrate;
a filter element disposed on the image sensing chip; and
a lens assembly comprising a holder structure disposed on the circuit substrate and a lens structure disposed on the holder structure;
wherein the upper surface of the circuit substrate includes a chip placing area, a first solder area, and a second solder area; the first solder area is connected between a first side of the chip placing area and a first side of the circuit substrate, the second solder area is connected between a second side of the chip placing area and a second side of the circuit substrate, and a third side of the chip placing area is connected to a third side of the circuit substrate;
wherein the upper surface of the image sensing chip includes an image sensing area, a carrier area, a first conductive area, and a second conductive area; the first conductive area is connected between a first side of the carrier area and a first side of the image sensing chip, the second conductive area is connected between a second side of the carrier area and a second side of the image sensing chip, and the carrier area surrounds the image sensing area, and a third side of the carrier area is connected to a third side of the image sensing chip;
wherein the lower surface of the filter element has a light transmitting area and a connecting area surrounding the light transmitting area;
wherein the first conductive area of the image sensing chip and the second conductive area are electrically and respectively connected to the first solder area and the second solder area of the circuit substrate, and the connecting area of the filter element corresponds to the carrier area of the image sensing chip.

6. The portable electronic device according to claim 5, wherein the first solder area includes a plurality of first solder pads, the second solder area includes a plurality of first solder pads, the first conductive area includes a plurality of first conductive parts electrically connected to the first solder pads by respectively passing through a plurality of first conducting wires, and the second conductive area includes a plurality of second conductive parts electrically connected to the pads by respectively passing through a plurality of second conducting wires; wherein the first solder area is disposed opposite to the second solder area, and an adhesive is disposed between the carrier area and the connecting area, so that the filter element is disposed on the carrier area of the image sensing chip by the adhesive.

7. The portable electronic device according to claim 5, wherein a fourth side of the chip placing area is connected to a fourth side of the circuit substrate, and a fourth side of the carrier area is connected to a fourth side of the image sensing chip; wherein the first side of the circuit substrate is disposed opposite to the second side, and the third side of the circuit substrate is disposed opposite to the fourth side; wherein the first side of the chip placing area is opposite to the second side, and the third side of the chip placing area is opposite to the fourth side; wherein the first side of the image sensing chip is opposite to the second side, and the third side of the image sensing chip is opposite to the fourth side; wherein the first side of the carrier area is opposite to the second side, and the third side of the carrier area is opposite to the fourth side.

8. The portable electronic device according to claim 5, wherein the upper surface of the circuit substrate includes a third solder area, and the third solder area is connected between a fourth side of the chip placing area and a fourth side of the circuit substrate; wherein the upper surface of the image sensing chip includes a third conductive area, and the third conductive area is connected between a fourth side of the carrier area and a fourth side of the image sensing chip; wherein the first conductive area of the image sensing chip and the second conductive area are electrically and respectively connected to the first solder area and the second solder area of the circuit substrate.

9. An image capturing module, comprising:
a circuit substrate including an upper surface and a lower surface;
an image sensing chip disposed on the upper surface of the circuit substrate;
a filter element disposed on the image sensing chip; and
a lens assembly comprising a holder structure disposed on the circuit substrate and a lens structure disposed on the holder structure;
wherein the upper surface of the circuit substrate includes a chip placing area and a first solder area, and the first solder area is connected between a first side of the chip placing area and a first side of the circuit substrate;
wherein the upper surface of the image sensing chip includes an image sensing area, a carrier area, and a first conductive area; the first conductive area is connected between a first side of the carrier area and a first side of the image sensing chip, and the carrier area surrounding the image sensing area;
wherein the lower surface of the filter element has a light transmitting area and a connecting area surrounding the light transmitting area;
wherein the first conductive area of the image sensing chip is electrically connected to the first solder area of the circuit substrate, and the connecting area of the filter element corresponds to the carrier area of the image sensing chip.

10. The image capturing module according to claim 9, wherein the first solder area includes a plurality of first solder pads, and the first conductive part includes a plurality of first conductive parts electrically connected to the first solder pads by respectively passing through a plurality of first conducting wires; wherein an adhesive is disposed between the carrier area and the connecting area, so that the filter element is disposed on the carrier area of the image sensing chip by the adhesive.

* * * * *